United States Patent [19]

Yu et al.

[11] Patent Number: 5,702,980
[45] Date of Patent: Dec. 30, 1997

[54] METHOD FOR FORMING INTERMETAL DIELECTRIC WITH SOG ETCHBACK AND CMP

[75] Inventors: Chen-Hua Douglas Yu; Sylin-Ming Jang, both of Hsin-Chu, Taiwan

[73] Assignee: Taiwan Semiconductor Manufacturing Company Ltd, Hsin-Chu, Taiwan

[21] Appl. No.: 616,415

[22] Filed: Mar. 15, 1996

[51] Int. Cl.⁶ .................................................. H01L 21/28
[52] U.S. Cl. .......................... 437/187; 437/195; 437/231; 437/238
[58] Field of Search .................... 437/50, 187, 195, 437/231, 238, 239, 240, 978

[56] References Cited

U.S. PATENT DOCUMENTS

| | | | |
|---|---|---|---|
| 4,894,351 | 1/1990 | Batty | 437/195 |
| 5,252,515 | 10/1993 | Tsai et al. | 437/195 |
| 5,302,233 | 4/1994 | Kim et al. | 437/249 |
| 5,393,708 | 2/1995 | Hsia et al. | 437/238 |
| 5,457,070 | 10/1995 | Hirade | 437/195 |
| 5,536,681 | 7/1996 | Jang et al. | 437/978 |
| 5,552,344 | 9/1996 | Jang et al. | 437/195 |

FOREIGN PATENT DOCUMENTS

| | | |
|---|---|---|
| 0523856-A2 | 1/1993 | European Pat. Off. . |
| 6-283523 | 7/1994 | Japan . |

OTHER PUBLICATIONS

S. Wolf "Silicon Processing for the VLSI Era, vol. 1", Lattice Press, p. 183, 1986.

*Primary Examiner*—George R. Fourson
*Assistant Examiner*—Thomas G. Bilodeau
*Attorney, Agent, or Firm*—George O. Saile; Stephen B. Ackerman; Larry J. Prescott

[57] ABSTRACT

A defect free intermetal dielectric, IMD, and method of forming the defect free IMD are described. The IMD uses spacers formed by means of etchback of a layer of spin-on-glass, SOG. In order to use an oxide layer formed by means of plasma enhanced tetra-ethyl-ortho-silicate, PE-TEOS, as part of the IMD an oxide cap layer formed using plasma enhanced chemical vapor deposition, PE-CVD, is used to isolate the SOG spacers from the PE-TEOS formed oxide layer. By isolating the PE-TEOS formed oxide layer from the SOG spacers a reliable and defect free IMD is achieved.

10 Claims, 2 Drawing Sheets

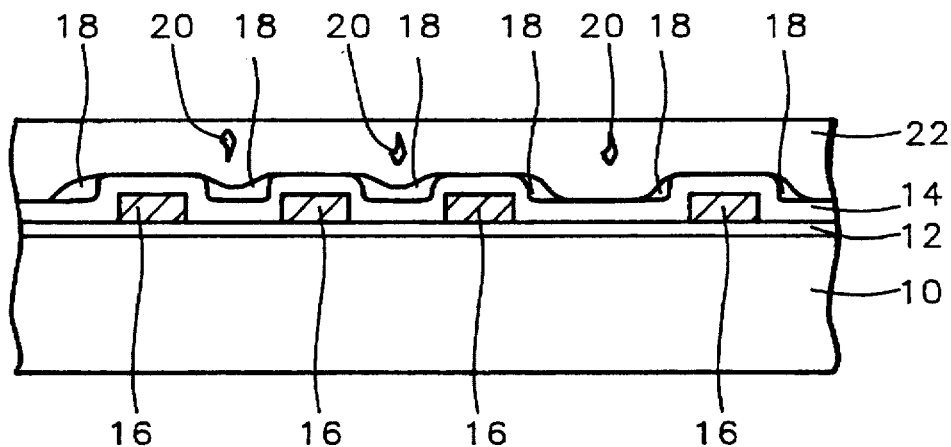
FIG. 1 — Prior Art
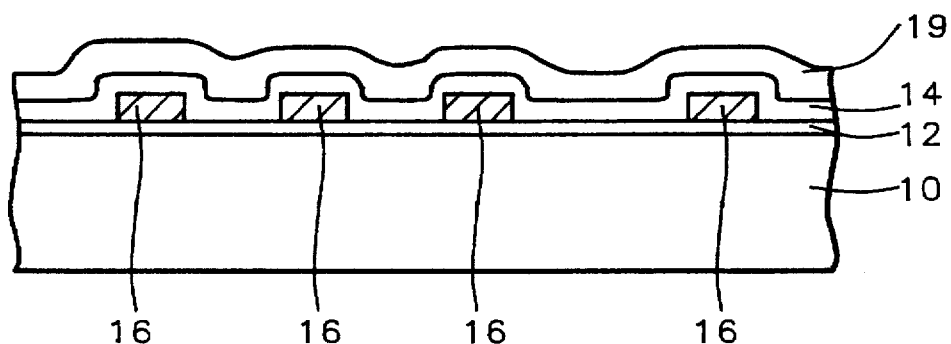
FIG. 2
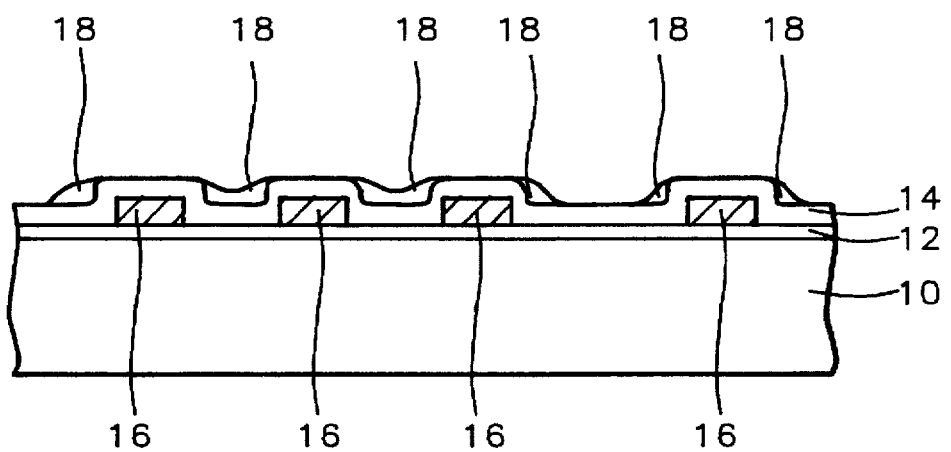
FIG. 3

METHOD FOR FORMING INTERMETAL DIELECTRIC WITH SOG ETCHBACK AND CMP

BACKGROUND OF THE INVENTION

(1) Field of the Invention

An intermetal dielectric using spin-on-glass etchback and method of forming the intermetal dielectric using spin-on-glass etchback. More specifically using an oxide cap layer, formed by means of plasma enhanced chemical vapor deposition, to isolate an intermetal oxide layer, formed using plasma enhanced tetra-ethyl-ortho-silicate, from SOG spacers.

(2) Description of the Related Art

In integrated circuit elements using dense electrode patterns where spaces between electrodes is very small spin-on-glass, SOG, is often used as a spacer material to provide good step coverage over the electrodes. Additional oxide layers are then used to form the intermetal dielectric, IMD. It is desirable to use an oxide layer formed using plasma enhanced tetra-ethyl-ortho-silicate, PE-TEOS, as an additional oxide layer to form the IMD however when an oxide formed using PE-TEOS and SOG make direct contact device function and reliability are adversely affected. This invention uses a oxide cap layer formed using PE-CVD to isolate the oxide layer formed using PE-TEOS from the SOG.

U.S. Pat. No. 5,252,515 to Tsai et al. describes methods for forming a SOG sandwich structure with two layers under the SOG layer but does not describe using an oxide cap layer to isolate SOG form an oxide layer formed using PE-TEOS.

SUMMARY OF THE INVENTION

Integrated circuit elements often have two or more wiring levels separated by an intermetal dielectric where the spacing between electrodes on some or all of the wiring levels is very small. In these instances the intermetal dielectric must fill the spaces between the electrodes to form a smooth planar surface for the next wiring level. Spin on Glass, or SOG, is often used as a filler material to fill the spaces between electrodes.

FIG. 1 shows a conventional intermetal dielectric using SOG for filling and smoothing the spaces between electrodes. FIG. 1 shows a semiconductor integrated circuit substrate 10 having devices, not shown, formed therein and a base dielectric layer 12 formed thereon. A pattern of electrodes 16 is formed on the base dielectric layer 12. An oxide underlayer 14, such as silicon dioxide, having a thickness of between about 500 and 2000 Angstroms is formed over the base dielectric layer 12 covering the electrodes 16 by means of plasma enhanced chemical vapor deposition, PECVD. Since the PE-CVD formed oxide underlayer 14 has poor step coverage over the electrodes 16, a layer of spin on glass, not shown, having a thickness of between about 2000 and 6000 Angstroms is formed over the oxide underlayer 14. The spin on glass, SOG, is then etched back leaving SOG 18 at the electrode pattern edges and spaces between electrodes, as shown in FIG. 1. The etchback of the SOG layer must be sufficient to remove all SOG from that part of the oxide underlayer 14 directly over the electrodes 16. An intermetal oxide layer 22, such as silicon dioxide, having a thickness of between about 6000 and 8000 Angstroms is then formed over the oxide underlayer 14 and remaining SOG 18 by means of plasma enhanced chemical vapor deposition, PE-CVD, to complete the intermetal dielectric.

There are problems associated with this conventional formation of an intermetal dielectric. The etchback of the SOG must insure that there is no SOG left on that part of the oxide underlayer 14 directly over the electrodes 18 to avoid via poisoning. In order to assure adequate etchback the amount of SOG left at the edges of the electrodes and the spaces between electrodes may be compromised. In addition the poor step coverage of the intermetal oxide layer 22 may lead to defects 20 in the intermetal oxide layer 22.

It is a principle objective of this invention to provide a method of forming an intermetal dielectric using oxide layers having good step coverage to avoid the problems experienced with the conventional method.

It is another principle objective of this invention to provide an intermetal dielectric which is void free and avoids via poisoning.

These objectives are achieved by forming a thin oxide cap layer having a thickness of between about 500 and 2000 Angstroms over the first oxide layer and SOG remaining after etchback by means of plasma enhanced chemical vapor deposition using $SiH_4$ and $O_2$ as a precursor. An intermetal oxide layer having a thickness of between about 6000 and 8000 Angstroms is then deposited over the oxide cap layer by means of plasma enhanced deposition of tetra-ethyl-ortho-silicate, PE-TEOS. The PE-TEOS intermetal oxide layer has good step coverage and avoids the problems of void and other defect formation. Oxides formed using PE-TEOS can not be used directly over SOG because the moisture absorption characteristics of such films will cause problems. Use of the PE-TEOS intermetal oxide layer is made possible by the oxide cap layer formed using PE-CVD which acts as a cap over the SOG. The PE-CVD oxide cap layer has a much smaller tendency to absorb moisture than the PE-TEOS intermetal oxide layer. Chemical mechanical polishing, CMP, is then used to planarize the intermetal dielectric.

BRIEF DESCRIPTION OF THE DRAWINGS

FIG. 1 shows a cross section view of a semiconductor integrated circuit element having a conventional intermetal dielectric.

FIG. 2 shows a cross section view of a semiconductor integrated circuit having a PE-CVD formed oxide underlayer with a layer of SOG formed on the oxide underlayer.

FIG. 3 shows a cross section view of a semiconductor integrated circuit having a PE-CVD formed oxide underlayer with SOG formed on the oxide underlayer and etched back.

DESCRIPTION OF THE PREFERRED EMBODIMENTS

Figure 4:
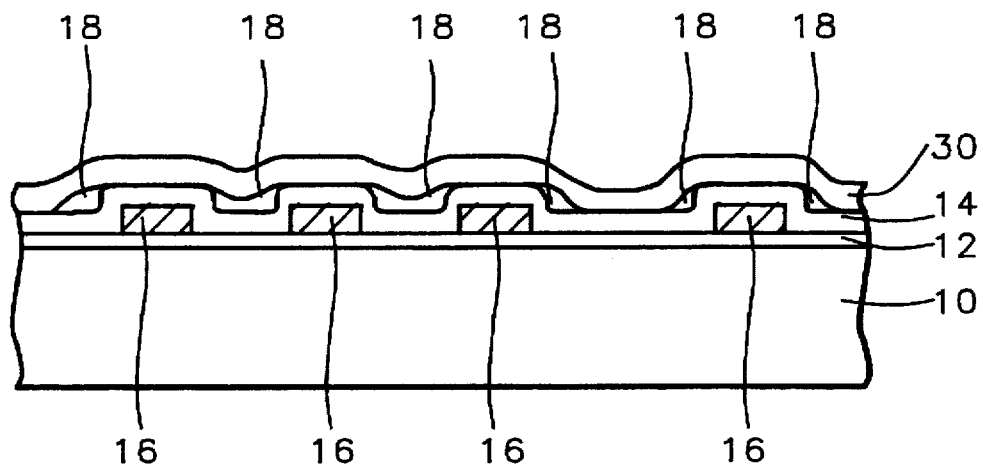
FIG. 4 shows a cross section view of a semiconductor integrated circuit having a PE-CVD formed oxide cap layer formed over the oxide underlayer and SOG remaining after etchback.

Refer now to FIGS. 2-5, there is shown the preferred embodiment of the intermetal dielectric and method of forming the intermetal dielectric of this invention. FIG. 2 shows a cross section view of a semiconductor integrated circuit element 10 having devices formed therein, not shown, and a base dielectric layer 12 formed thereon. A pattern of electrodes 16 is formed on the base dielectric layer. The electrodes 16 shown in FIG. 2 are in a first metal layer and will have contacts, not shown, for connection to electrodes in other metal layers. The electrodes will have appropriate contacts, not shown, to the devices formed in the semiconductor integrated circuit element.

A dielectric underlayer 14 is formed on the base dielectric layer and covers the electrodes 16. In this embodiment the dielectric underlayer 14 is an oxide underlayer, such as silicon dioxide, formed using plasma enhanced chemical vapor deposition, PE-CVD, and has a thickness of between about 500 and 2000 Angstroms. Next a layer of spin-on-glass 19, SOG, having a thickness of between about 2000 and 6000 Angstroms is formed on the oxide underlayer 14. Next, as shown in FIG. 3, an etchback of the SOG layer is carried out using $CHF_3$, $CF_4$, and $O_2$ so that all SOG is removed from that part of the oxide underlayer 14 over the electrodes leaving SOG spacers 18 at the edges of the electrodes 16 and in the spaces between electrodes.

The etchback of the SOG must insure that no SOG remains on those parts of the oxide underlayer 14 which are directly over the electrodes 16 to prevent via poisoning when connections to higher metal layers are formed. To insure no SOG remains directly over the electrodes the SOG may be slightly overetched and step coverage of the SOG spacers 18 may be diminished.

Next it is desirable to deposit a layer of dielectric having good step coverage such as an oxide layer formed using plasma enhanced deposition of tetra-ethyl-ortho-silicate, PE-TEOS, however the PE-TEOS layer can not contact the SOG spacers 18 because of problems with moisture and charge accumulation. Next, to avoid the problem with PE-TEOS and SOG contact, a thin dielectric cap layer, in this embodiment an oxide cap layer 30 such as silicon dioxide, is formed over the oxide underlayer 14 and the SOG spacers 18, see FIG. 4. The oxide cap layer 30 is formed using plasma enhanced chemical vapor deposition, PE-CVD, and has a thickness of between about 500 and 2000 Angstroms.

Figure 5:
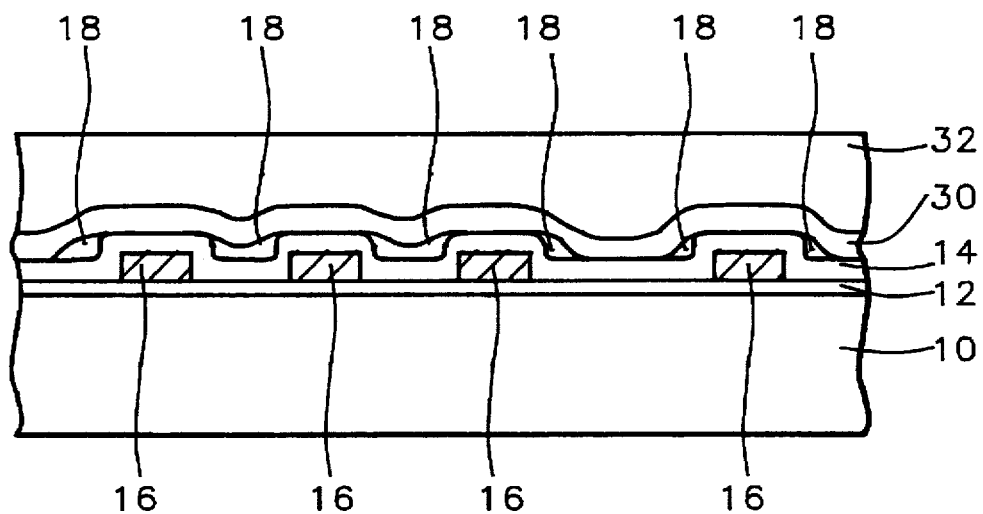
FIG. 5 shows a cross section view of a semiconductor integrated circuit having a PE-TEOS intermetal oxide layer formed over the PE-CVD formed oxide cap layer.

Next, as shown in FIG. 5, an intermetal oxide layer 32, such as silicon dioxide, having a thickness of between about 6000 and 8000 angstroms is formed over the oxide cap layer 30 using PE-TEOS. The oxide cap layer 30, formed using PE-CVD, has poor step coverage but prevents the SOG spacers 18 from contacting the intermetal oxide layer 32 formed using PE-TEOS. The PE-TEOS formed intermetal oxide layer 32 has good step coverage and completes a defect free intermetal dielectric. Next the intermetal oxide layer 32 is planarized using chemical mechanical polishing, CMP, to prepare the intermetal dielectric for the next metal layer.

The completed intermetal dielectric is shown in FIG. 5. A base dielectric layer 12 is formed on an integrated circuit element 10 with devices formed therein, not shown. An electrode pattern 16 is formed on the base dielectric layer 12 which insulates the electrodes 16 from the integrated circuit element 10. An oxide underlayer 14, such as silicon dioxide, is formed over the base dielectric layer and SOG spacers 18 are formed on the oxide underlayer 14 so that no SOG remains on that part of the oxide underlayer directly over the electrodes 16. The oxide underlayer formed using PE-CVD and having a thickness of between about 500 and 2000 Angstroms prevents the SOG spacers from contacting the base dielectric layer 12. An oxide cap layer 30, formed using PE-CVD and having a thickness of between about 500 and 2000 Angstroms, is formed over the oxide underlayer 14 and the oxide spacers. A defect free intermetal oxide layer 32, such as silicon dioxide formed using PE-TEOS and having a thickness of between about 6000 and 8000 Angstroms, is then formed over the oxide cap layer 32. The PE-CVD formed oxide cap layer 30 prevents the SOG spacers 18 from contacting the PE-TEOS formed intermetal oxide layer 32. The intermetal oxide layer is then planarized using CMP and the intermetal dielectric is completed. Further metal layers can then be formed as desired.

While the invention has been particularly shown and described with reference to the preferred embodiments thereof, it will be understood by those skilled in the art that various changes in form and details may be made without departing from the spirit and scope of the invention.

What is claimed is:

1. A method of forming intermetal dielectric, comprising the steps of:
   providing a semiconductor substrate having devices formed therein;
   providing a layer of base dielectric formed on said semiconductor substrate;
   providing an electrode pattern formed on said layer of base dielectric;
   forming an oxide underlayer over said layer of base dielectric and said electrode pattern;
   forming a layer of spin-on-glass on said oxide underlayer;
   etching back said layer of spin-on-glass wherein said spin-on-glass is removed from that part of said oxide underlayer directly over said electrode pattern;
   forming an oxide cap layer over said oxide underlayer and that part of said layer of spin-on-glass remaining after etching back said layer of spin-on-glass, wherein said oxide cap layer is formed using plasma enhanced chemical vapor deposition with silane and oxygen;
   forming an intermetal oxide layer over said oxide cap layer, wherein said intermetal oxide layer is formed using plasma enhanced deposition of tetra-ethyl-ortho-silicate; and
   planarizing said intermetal oxide layer.

2. The method of claim 1 wherein said oxide underlayer is silicon dioxide formed using plasma enhanced chemical vapor deposition with $SiH_4$ and $O_2$ precursors.

3. The method of claim 1 wherein said oxide underlayer is silicon dioxide having a thickness of between about 500 and 2000 Angstroms.

4. The method of claim 1 wherein said oxide cap layer is silicon dioxide.

5. The method of claim 1 wherein said oxide cap layer is silicon dioxide having a thickness of between about 500 and 2000 Angstroms.

6. The method of claim 1 wherein said intermetal oxide is silicon dioxide.

7. The method of claim 1 wherein said intermetal oxide is silicon dioxide having a thickness of between about 6000 and 8000 Angstroms.

8. The method of claim 1 wherein said planarizing of said intermetal oxide layer is carried out using chemical mechanical polishing.

9. The method of claim 1 wherein said layer of spin-on-glass has a thickness of between about 2000 and 6000 Angstroms before said etching back of said spin-on-glass layer.

10. The method of claim 1 wherein said etching back of said spin-on-glass layer uses $CF_4$, $CHF_3$, and $O_2$.

* * * * *